United States Patent [19]
Linn et al.

[11] Patent Number: 5,451,263
[45] Date of Patent: Sep. 19, 1995

[54] PLASMA CLEANING METHOD FOR IMPROVED INK BRAND PERMANENCY ON IC PACKAGES WITH METALLIC PARTS

[75] Inventors: Jack H. Linn, Melbourne; Mike M. Higley, Palm Bay; Craig S. Arruda, Palm Bay; Martin E. Walter, Palm Bay, all of Fla.

[73] Assignee: Harris Corporation, Melbourne, Fla.

[21] Appl. No.: 195,667

[22] Filed: Feb. 3, 1994

[51] Int. Cl.$^6$ .................................................. B08B 7/00
[52] U.S. Cl. ........................................ 134/1.1; 134/2; 134/30; 204/192.32
[58] Field of Search .................. 134/1, 2, 30; 204/192.32; 156/643

[56] References Cited

U.S. PATENT DOCUMENTS

| | | | |
|---|---|---|---|
| 4,797,178 | 1/1989 | Bui et al. | 134/1 |
| 4,913,929 | 4/1990 | Moslehi et al. | 118/715 |
| 5,174,856 | 12/1992 | Hwang et al. | 156/643 |

Primary Examiner—David A. Simmons
Assistant Examiner—Sean Vincent
Attorney, Agent, or Firm—Daniel Staudt; Joel I. Rosenblatt

[57] ABSTRACT

A gas phase plasma cleaning method and apparatus is shown for removing contaminants from the surface of exposed metallic parts on integrated circuits (IC's). A two step method is shown using a defined gas mixture of argon and oxygen, and ammonia and hydrogen. The gases are separately introduced into a plasma chamber. The argon oxygen mixture is used to remove carbonatious material by chemical reaction and by milling. The ammonia hydrogen mixture is introduced to chemically remove and reduce oxides and phosphates. Surface energies are increased to permit improved adhesion of inks. Additionally, intermediate oxides formed after the plasma exposure prevent complete regrowth of the normally passivating oxide layer.

10 Claims, 2 Drawing Sheets

PLASMA CLEANING METHOD FOR IMPROVED INK BRAND PERMANENCY ON IC PACKAGES WITH METALLIC PARTS

FIELD OF THE INVENTION

This invention relates to the field of cleaning exposed metal parts on integrated circuits (IC's). It relates particularly to the cleaning of nickel plated parts to increase surface energies for the purpose of applying ink markings or for solder connections with other metal parts.

BACKGROUND OF THE INVENTION

Ink brand permanency on metallic IC package lids has always been a critical issue in the semiconductor industry. Lid brands often identify information about the device type, the IC manufacturer, and the date of production. It is not uncommon for semiconductor users to subject IC packages to various chemical cleans before and after attachment to PC boards. If ink adhesion is not satisfactory and/or ink cure is incomplete, the brand may be degraded during the various cleaning operations and become partially or completely illegible. Long-term exposure to reactive ambients (e.g. high humidity, corrosive or polluted air, etc. ) can also cause slow degradation of poorly adhered or cured ink brands. Loss of the branding information can result in IC's which are unidentifiable. For this reason, MIL-STD tests have been developed and instituted in the semiconductor industry to evaluate ink brand permanency on package lids. Moisture resistance tests (and salt air exposure) can also help determine brand permanency under more aggressive conditions.

Various lid cleaning, inking, and curing methods have been developed and modified to enhance the brand permanency on metallic lids. One of the most difficult factors to control is the surface chemistry and cleanliness of the metal lid. This directly affects the bonding of the ink to the metal. The branding ink will not bond satisfactorily to lid surfaces that contain inordinate quantities of metallic oxides or hydrocarbons or other contaminants. These surface contaminants can accumulate from the thermal treatments during the lid seal process and burn-in. Normal workplace air exposure, as well as machine and human handling (e.g. fingerprints), can also contribute to surface contamination of the lid. Overall, the most common cause of brand loss is due to lifting or delaminating ink caused by poor ink bonding to the lid.

Current branding operations for metallic lids, and more specifically nickel plated lids such as electroplated or electroless plated nickel lids or gold plated nickel, involve the use of wet chemical cleans. These include basic solutions, which have pH values greater than 10 (e.g. Markem 535), and solvents like isopropyl alcohol (IPA), freon, and HCFC. These solutions are recommended as standard surface cleaning methods by the ink vendors and generally result in improved brand permanency compared to uncleaned lids. However, one disadvantage of these wet chemical cleans is the entire package must be immersed. The Markem 535 solution, for example, contains monoethanolamine and is quite basic (pH>11). Hence, it tends to attack or etch various other materials associated with the packages. The attack is especially notable on the soldered leads, the lid-to-seal ring weld area, and the various plated metallic codes on the packages. This particular brand pre-clean can cause a darkening of these surfaces due to an accelerated build-up of oxides and the formation of 'phospho-oxides' on electroless Ni plated surfaces. The ceramic package material is also etched. In most cases, these anomalies are cosmetic. However, many incidents of darkened leads and/or darkened weld areas are incorrectly assumed to be caused by latent corrosion or thermal stress, when in fact, they are caused by the brand pre-clean solution.

Lead solderability is also affected by the pre-branding cleans. The oxides and 'phospho-oxides' are difficult to remove and can prevent good eutectic formation between the base metal and the solder. Leads solder dipped prior to brand also often exhibit a darkening and pitting of the solder. Reduced solderability is observed in these units as well.

Another drawback of the wet cleaning method is the use of solutions which are costly, difficult to dispose of, and are detrimental to the environment. Maintaining and changing these chemical baths, as well as keeping accurate records of bath changes and chemical disposal, are tedious and time consuming. In addition, several of these solutions can be potentially harmful to workers over a period of extended exposure.

SUMMARY OF THE INVENTION

Disclosed is a method and apparatus for cleaning exposed metal parts on an integrated circuit (IC). According to the inventive principles as shown in the preferred embodiment, an IC may be placed in a plasma chamber with a defined gaseous mixture. An RF field is created around the IC for a set period of time. The plasma created in the gaseous mixture by the RF energy is sufficient to remove contaminants on the surface of the metal parts such as the electroless plated nickel lid of the IC. Oxygen and argon may be introduced to form the plasma. The oxygen is useful for removing carbonaceous material while the argon provides a milling effect to remove other contaminants. Another mixture which may be introduced is ammonia and hydrogen. The hydrogen in the ammonia hydrogen gas mixture reduces the nickel oxides to nickel and the ammonia is used to etch and remove nickel phosphates.

According to the inventive principles, as shown for the preferred embodiment, surface energies greater than 60 dynes/cm are attainable. Further, plasma exposure is shown to passivate a metal surface and prevent a complete regrowth of the normal passivating oxide layer.

DESCRIPTION OF PREFERRED EMBODIMENT

The inventive method is shown disclosed used in connection with the cleaning of electroless plated nickel lids and other metallic exposed parts for integrated circuits (IC's). The plated electroless nickel in the preferred embodiment is over Kovar (iron, nickel and cobalt). The IC package may consist of ceramic body, brazed lead pads, electroless nickel plated leads and lid lead pads and a seal ring. As known to those skilled in the art, the phosphorous content of the electroless nickel plate is between 7 and 11%. In the preferred environment, the lid to seal ring attachment is a cold weld seal.

Figure 1:
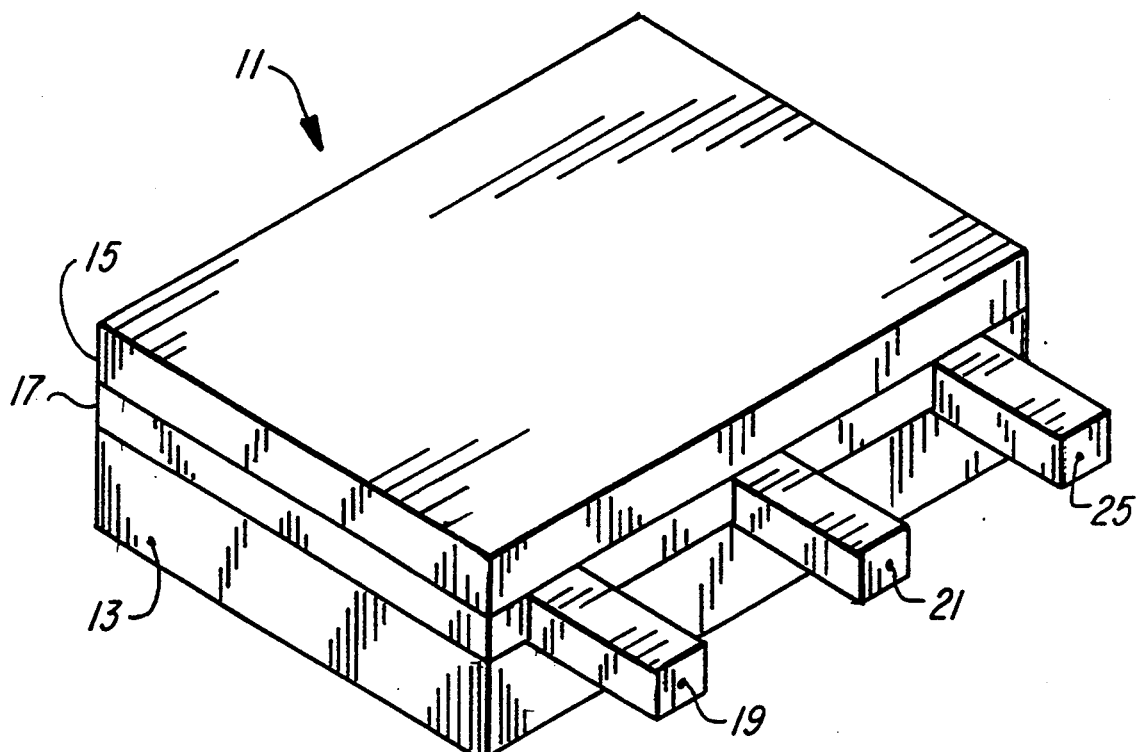
FIG. 1. shows a lid sealed integrated circuit, as an example.

IC packages are well known in the art and are shown in FIG. 1 as an example and for reference purposes only.

As shown in FIG. 1, an IC is indicated generally as 11. The IC comprises a ceramic body 13 and a lid 15. For the preferred environment, the lid is made up of electroless nickel. A seal 17 is shown between the lid 15 and the ceramic body 13. An electrical circuit is within the ceramic body 13 and enclosed by seal 17 and lid 15. Extending from the electrical circuit are leads 19, 21 and 25. As would be known to those skilled in the arts, additional leads (not shown) may extend from both sides of the IC 11.

Figure 2:
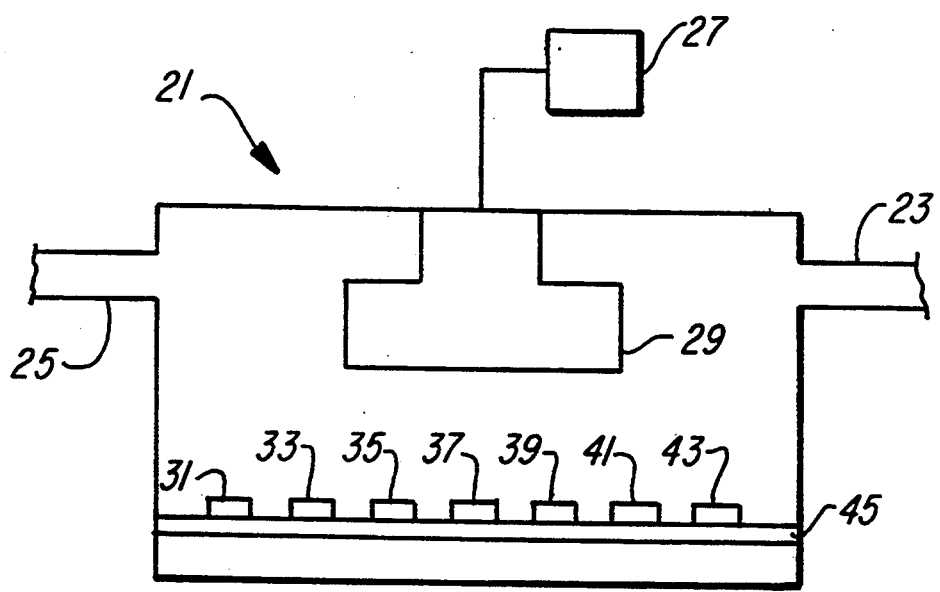
FIG. 2. shows a schematic form, a representation of a plasma chamber used in accordance with the present invention to clean the sealed integrated circuit surface.

According to the inventive principles, the lid and the leads are cleaned using a plasma cleaning process with the defined gases. In a preferred environment, a plasma chamber as shown schematically in FIG. 2 is used. The plasma chamber has a gas inlet 23 and outlet 25. A source of power 27 is connected to an RF generator 29. The IC's are shown as 31, 33, 35, 37, 39, 41, 43 on metal tray 45 within the chamber 21. In the preferred embodiment, the chamber is operated at 14.56 MHz with RF power at 2 kW. The IC's were maintained at 70° C. throughout the plasma exposure. Any suitable plasma chamber may be used. In the preferred environment an Advanced Plasma Systems Corporation (APS) tool was used.

Figure 3:
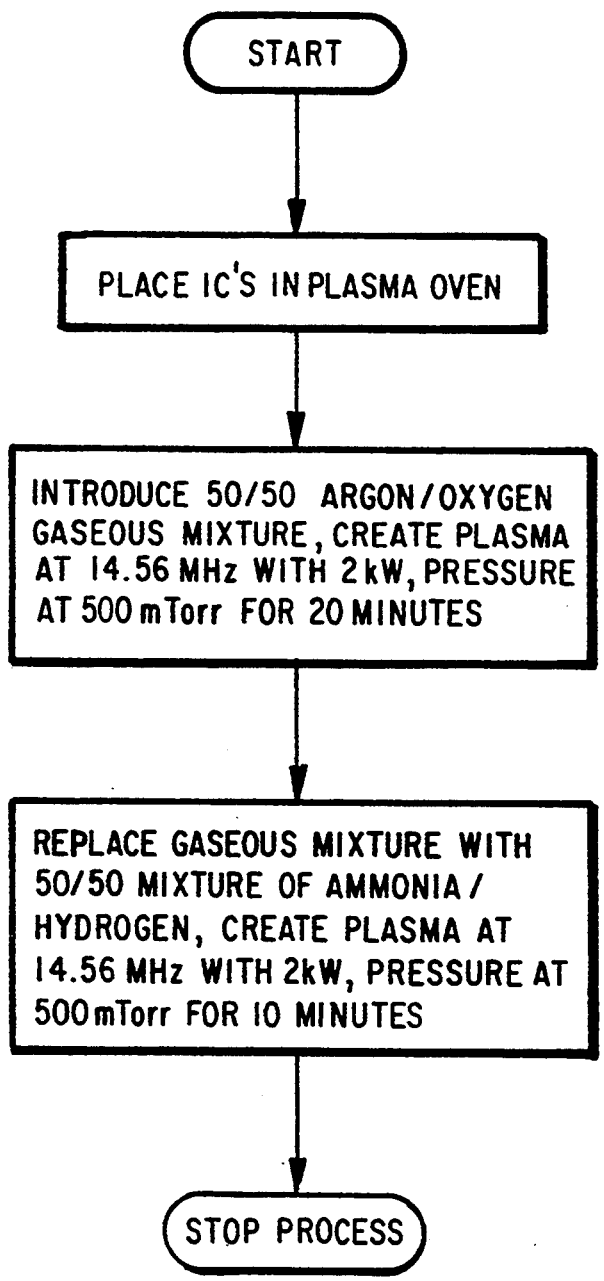
FIG. 3. is a flow chart of the process of the present invention for cleaning the integrated circuit surfaces.

The plasma cleaning process according to the inventive principles and as shown in the flow chart of FIG. 3 was created by placing the IC's in the APS tool with a 50% argon and 50% oxygen gaseous mixture at 500 mTorr for twenty minutes. This plasma cleaning process was followed immediately by a 500 mTorr ammonia/hydrogen plasma cleaning for ten minutes. As stated above, the plasma was generated at 14.56 MHz at 2 kW and the IC was maintained at 70° C.

An IC package construction consisting of a ceramic package body, brazed lead pads, nickel plated leads, brazed pads, and a lid when cleaned according to the inventive principles described above tests show no noticeable physical deterioration is produced on the exposed metal parts.

The use of the argon oxygen gaseous mixture in the plasma removes carbonaceous material from the lead by chemical reaction and by milling. The milling effect is produced by the argon which works with the chemical reaction by the oxygen to remove all of the residual carbonaceous material. The hydrogen, in the ammonia hydrogen gas mixture, reduces nickel oxides to nickel while the ammonia is used to etch and remove the nickel phosphates.

Cleaning according to the inventive principles, surface energies greater than 60 dynes/cm. This is a level high enough to consistently obtain satisfactory ink brand adhesion to the electroless nickel surface. For comparison surfaces, unclean nickel leads with normal passivating layers of nickel oxide and surface contaminates typically possess values in the energy of 30 to 40 dynes/cm range and produce unsatisfactory ink adhesion.

In the preferred environment, an ink brand was stamped on the lid within 30 minutes after cleaning.

The inventive principles are shown with regard to an electroless nickel plated lid used with an IC. The lid is cleaned using a plasma cleaning process with the defined gases to remove material covering the nickel and to increase its surface energy for better adhesion of an ink brand. The inventive principles are not limited to the disclosed invention but may be used with some electro-plated nickel or gold plated stamp nickel or with other materials by varying the gas mixture.

According to the inventive principles, the use of plasma with gases may be successfully used to remove contaminates on the surface of a material by chemical reaction or by milling.

Further, the plasma reduction of the surface contaminates passivates the surface and then minimizes regrowth of oxides after air exposure.

A flow chart for the process is as shown in FIG. 3. The process is shown with respect to the defined gaseous mixture of ammonia and hydrogen and for argon/oxygen.

The indications are intermediate oxides form after the plasma exposure. This plasma exposure passivates a metal surface and prevents a complete regrowth of the normally passivating oxide layer. This limiting of the oxide regrowth allows for at least one hour to pass after the cleaning process before surface energy degrades below 60 dynes/cm.

We claim:

1. A method of cleaning the exterior portions of an integrated circuit package for subsequently marking the exterior portions of tho integrated circuit package with identifying characters comprising the steps of:

placing the integrated circuit package into a plasma chamber;

energizing a radio frequency plasma atmosphere with oxygen and argon in the plasma chamber;

exposing the integrated circuit package to the oxygen and argon atmosphere in the plasma chamber for a first period of time for removing carbonaceous and ionic contaminants from the integrated circuit package;

deenergizing the plasma atmosphere and removing the oxygen and argon gases from the plasma chamber after the first period of time has expired;

energizing a radio frequency plasma atmosphere with hydrogen and ammonia in the plasma chamber; and exposing the integrated circuit package to the hydrogen and ammonia plasma atmosphere for a second period of time for removing oxides and phosphates from the integrated circuit package.

2. The method of 1 wherein said step of energizing an oxygen and argon plasma atmosphere in the plasma chamber is further defined by introducing about 50% oxygen and about 50% argon into the plasma chamber.

3. The method of claim 1 wherein said step of energizing a hydrogen and ammonia plasma atmosphere in the plasma chamber is further defined by introducing about 50% hydrogen and about 50% ammonia into the plasma chamber.

4. The method of claim 1 wherein the steps of energizing a radio frequency plasma atmosphere in the plasma chamber is further defined by establishing and maintaining the plasma chamber at about 500 mTorr.

5. The method of claim 1 wherein the step of exposing the integrated circuit package for the Brat period of time is further defined by exposing the integrated circuit package for about 20 minutes to the oxygen and argon radio frequency plasma atmosphere.

6. The method of claim 1 wherein the step of exposing the integrated circuit package for the second period of time is further defined by exposing the integrated circuit package for about 10 minutes to the hydrogen and ammonia radio frequency plasma atmosphere.

7. The method of claim 1 wherein the steps of energizing the plasma atmospheres in the plasma chamber is further defined by establishing and maintaining the plasma chamber at about 70 degrees Celsius.

8. A method of cleaning exterior portions of a metal for subsequently marking the exterior portions of the metal with identifying characters, comprising the steps of:

energizing a radio frequency plasma atmosphere with oxygen and argon in a plasma chamber at about 500 mTorr of pressure, with about 2 kW of power, at about 70 degrees Celsius, and at approximately, 14.56 MHz;

exposing the metal to the oxygen and argon plasma atmosphere in the plasma chamber to remove surface contaminates from the exterior portions of the metal;

deenergizing the plasma atmosphere;

removing the oxygen and argon gases from the plasma chamber;

energizing a radio frequency plasma atmosphere with hydrogen and ammonia in the plasma chamber at about 500 mTorr of pressure, with about 2 kW of power, at about 70 degrees Celsius, and at 14.56 MHz;

exposing the metal to the hydrogen and ammonia plasma atmosphere to further remove surface contaminates from the exterior portions of the metal.

9. The method of claim 8 wherein step of exposing the metal to oxygen and argon plasma, atmosphere is further defined by exposing the metal to approximately equal portions of oxygen and argon in order to remove the carboneous and ionic surface contaminates .from the exterior portions of the metal.

10. The method of claim 8 wherein step of exposing the metal to hydrogen and ammonia plasma atmosphere is further defined by exposing the metal to proportions of hydrogen and ammonia in order to remove the oxides and phosphates from the exterior portions of the metal and maintain the exterior portions contaminate free.

* * * * *